United States Patent
Venkatraman et al.

(10) Patent No.: US 7,440,356 B2
(45) Date of Patent: Oct. 21, 2008

(54) MODULAR DESIGN OF MULTIPORT MEMORY BITCELLS

(75) Inventors: Ramnath Venkatraman, San Jose, CA (US); Ruggero Castagnetti, Menlo Park, CA (US); Subramanian Ramesh, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 235 days.

(21) Appl. No.: 11/487,061

(22) Filed: Jul. 13, 2006

(65) Prior Publication Data

US 2008/0013383 A1     Jan. 17, 2008

(51) Int. Cl.
*G11C 8/00* (2006.01)
(52) U.S. Cl. .................. 365/230.05; 365/154
(58) Field of Classification Search ............ 365/230.05, 365/154, 156
See application file for complete search history.

(56) References Cited

U.S. PATENT DOCUMENTS

| | | | | |
|---|---|---|---|---|
| 5,644,547 A | * | 7/1997 | Grishakov et al. | 365/230.05 |
| 5,912,850 A | * | 6/1999 | Wood et al. | 365/201 |
| 6,044,034 A | * | 3/2000 | Katakura | 365/230.05 |
| 6,834,024 B2 | * | 12/2004 | Frydel | 365/230.05 |

* cited by examiner

*Primary Examiner*—Anh Phung
(74) *Attorney, Agent, or Firm*—North Weber & Baugh

(57) ABSTRACT

The present invention provides a system and method for designing and modularly expanding multiport bitcells. A modular design approach is described that reduces the complexity of designing multiport bitcells while complying with DFM rules across various semiconductor fabrication providers. The modular design may be parsed into modules such as read port modules, write port modules, and pull-up modules that may be easily interconnected to build a multiport bitcell. These modules may also be independently sized and assembled to achieve desired read margins, write margins, static noise margins as well as read access times and write times.

20 Claims, 11 Drawing Sheets

| Read Port-II | PW tap 305a | Left Module Write Port-I 306a | N-well 301 | Right Module Write Port-I 306b | Read Port-III |
|---|---|---|---|---|---|
| Left Module Write Port-III | Read Port-I 304 | Left Module Write Port-II 303a | | Right Module Write Port-II 303b | Right Module Write Port-III |

Figure 3

| | |
|---|---|
| Read Port-II Half | Read Port-II Half |
| Right Module Write Port-II | Right Module Write Port-I |
| N-Well | |
| Left Module Write Port-II | Left Module Write Port-I |
| Read Port-I Half | Read Port-I Half |

Figure 10

MODULAR DESIGN OF MULTIPORT MEMORY BITCELLS

BACKGROUND

A. Technical Field

The present invention relates generally to memory devices and more particularly, to a modular design and layout of a multiport memory bitcell having an expandable number of access ports.

B. Background of the Invention

Memory is an essential part of any computation system. A typical memory system may be viewed as a collection of sequential locations, each with a unique address and capable of storing information. Memories are broadly classified based on their functionality as Read Only Memory ("ROM") or Random Access Memory ("RAM"). Random access memories are further differentiated in static ("SRAM") or dynamic ("DRAM") RAM, depending on how the data is stored in the memory bitcell. Memory bitcells can have one or more ports to access stored data. Memory bitcells with multiple ports are typically referred to as multiport memory bitcells. A memory that uses such multiport memory bitcells enables multiple system elements to directly and independently access the contents of such multiport memory.

As shown in FIG. 1, a typically six transistor ("6T") SRAM bitcell comprises crossed-coupled inverters 102$a$, 102$b$ and two pass devices 104$a$, 104$b$ creating a differential port used to read from or write to the bitcell. In this example, both read or write operations are implemented differentially via two bit lines, BL 107$a$ and BLN 107$b$. The gates of two pass transistors in the bitcell are connected to a common wordline WL 107$c$. The cell is provided voltage via lines $V_{ss}$ 111$a$ and $V_{dd}$ 111$b$.

The number of ports within the bitcell may be increased by designing additional pass devices to the basic storage node. These additional ports may be dedicated to performing write operations while others are dedicated to performing read operations. A differential port may be used for either read or write operations, and employs two bitlines carrying complementary data for the write operation. A single-ended port may be used only for read operations and employs a single bitline. The differential port provides relatively fast access speeds due to the limited bitline swing required to produce a detectable differential signal that can be sensed by a sense-amplifier. Comparatively, a single-ended read port is relatively slower and requires a bitline to develop much larger swings in order to drive the next stage of logic circuitry. Single-ended read ports typically employ significantly larger devices than the pass devices in write ports.

FIG. 2 shows an exemplary dual port bitcell having a differential port A, bitlines 208$a$, 208$b$ and a single ended port B for bitline 209. A wordline 208$c$ is provided for port A while a separate wordline 209$c$ is provided for port B. When additional ports are attached to the cross-coupled inverter of a multiport cell, sufficient read, write and static noise margins need to be ensured. When designing a bitcell, these margin parameters need to be weighed against the read and write speed requirements of the cell. For example, pull-down devices on differential ports need to be properly designed to provide sufficient read and noise margin while not overly reducing the write speed of the ports. This tuning of the pull-down devices is less sensitive in single-ended ports and does not affect the beta ratio, read margin, and static noise margin of the cell. Accordingly, designers prefer to use single-ended ports for read ports and differential ports for write ports, which results in multiport cells having a combination of single-ended and differential ports. Furthermore, because of the different tuning requirements needed for various combinations of multiport cell requirements (e.g., the number of write vs. read ports), each multiport bitcell is typically designed from "scratch."

The design process for multiport bitcells is often complex because of performance and density requirements as well as manufacturability rules imposed by various semiconductor fabrication providers. As fabrication processes advance, the yield and performance of memory elements have become increasingly sensitive to process-layout interactions. Design for Manufacturability ("DFM") rules have been imposed on design layouts and geometries to improve yield on fabricated memory elements and achieve desired electrical results. These rules include requiring that poly gates run in the same direction, that diffusions are not completely enclosed, and a minimization of length of diffusion ("LOD") effects which reduces the current drive in an NMOS device due to the proximity of the isolation of the channel.

These DFM rules are intended to protect against fatal errors such as short circuits due to excessive misalignments or open circuits caused by excessive narrowing of metal or polysilicon. These rules often impose significant restrictions on multiport bitcell designs and significantly complicate the design process. The design process is further complicated because it is often difficult to leverage previous multiport bitcell designs into a new design. For example, if a designer wanted to expand the number of ports in a bitcell, he/she may be unable to leverage a significant portion of the smaller multiport bitcell in the new design.

As semiconductor fabrication techniques further advance, it is likely that DFM rules may become even more stringent and further complicate the design process. As a result, the ability to leverage previous bitcell designs when expanding the number ports may become even more difficult.

SUMMARY OF THE INVENTION

The present invention provides a system and method for designing and modularly expanding multiport bitcells. A modular design approach is described that reduces the complexity of designing multiport bitcells while complying with DFM rules across various semiconductor fabrication providers. The modular design may be parsed into modules such as read port modules, write port modules, and pull-up modules that may be easily interconnected to build a multiport bitcell. These modules may also be independently sized and assembled to achieve desired read margins, write margins, static noise margins as well as read access times and write times.

In various embodiments of the present invention, a multiport design layout structure is provided that comprises unidirectional polysilicon in one direction and diffusion segments in the opposite direction. These diffusion segments are not enclosed and do not contain any breaks along a memory array in order to minimize systematic process-induced non-uniformities between the devices in the memory bitcell. As a result of this and other aspects of the invention, modularly designed multiport bitcells are able to maintain compliance with the various DFM rules.

The bitcell may also be designed with voltage lines positioned to provide shielding between bitlines and or wordlines. This shielding reduces inter-port interference within the bitcell resulting in improved electrical performance.

In various embodiments of the invention, a multiport bitcell design may use split-gate devices that provide flexibility in adding ports to the cell. A read port may effectively be split into "top" and "bottom" halves with a common wordline connection. As a result, an engineer may adjust the width and/or height of a bitcell and improve the beta ratio for a given width used in the layout. These split-gate devices may also improve area efficiency within the bitcell and increase the read performance of the port without increasing the width of the bitcell.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("FIG.") 1 illustrates a circuit diagram of a prior art standard 6T SRAM bitcell.

FIG. 3 illustrates a schematic layout of a 6-port bitcell as per one embodiment of the invention.

FIG. 10 illustrates the schematic layout of a 4-port bitcell as per one embodiment of the present invention.

DETAILED DESCRIPTION OF THE PREFERRED EMBODIMENTS

Figure 1:
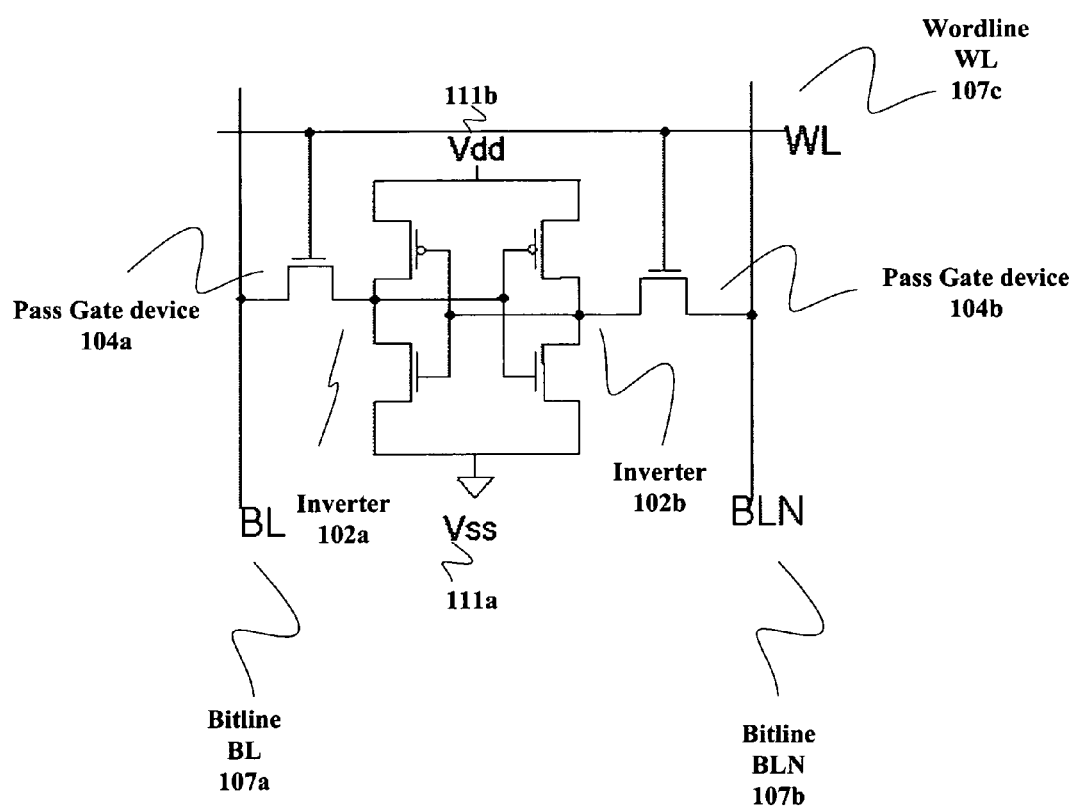
Figure 2:
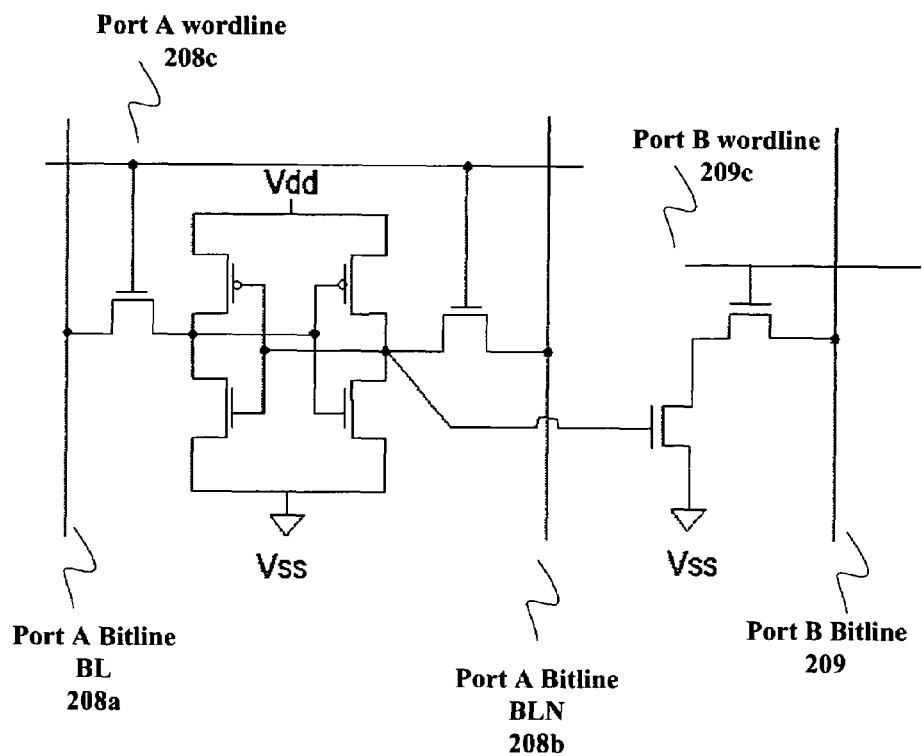
FIG. 2 illustrates a circuit diagram of a prior art dual port bitcell.

The present invention provides a system and method for designing and modularly expanding multiport bitcells. A modular design approach is described that reduces the complexity of designing multiport bitcells while complying with DFM rules across various semiconductor fabrication providers. The modular design may be parsed into modules such as read port modules, write port modules, and pull-up modules that may be easily interconnected to build a multiport bitcell. These modules may also be independently sized and assembled to achieve desired read margins, write margins, static noise margins as well as read access times and write times.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different memory cells and devices. Structures and devices shown below in block diagram are illustrative of exemplary embodiments of the invention and are meant to avoid obscuring the invention. Furthermore, connections between components within the figures are not intended to be limited to direct connections. Rather, signal between these components may be modified or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

FIG. 3 illustrates an exemplary six-port memory bitcell having three single-ended read ports and three differential write ports according to one embodiment of the invention. The ports are modularly designed around an N-well section 301 of the memory bitcell. Depending on the design requirements and area considerations, the added ports may be uniformly distributed about the N-well section 301. In this particular example, a first write port-I is a differential port having a left module 306a to the left of N-well section 301 and a right module 306b to the right of the N-well section 301. A second write port-II consists of a left module 303a and a right module 303b, both being modularly attached such that the left module 303a is located below the left module 306a of the write port-I and the right module 303b is located below the right module 306b of the write port-I.

As previously described, the read ports require only single ended ports so a single module may be used to create a read port. In this example, a read port-I 304 is located next to the left module 303a of the write port-II. Other components, such as a P-well tap 305a, may also be modularly designed into the multiport bitcell. Other single-ended read ports and differential write ports may be modularly placed into the design as shown in FIG. 3 depending on various factors including area efficiency.

One skilled in the art will recognize the advantages to modular design and layout schemes exemplified in FIG. 3. In particular, pre-existing multiport design elements may be leveraged to effectively expand the number of ports within a bitcell. The area efficiency of the bitcell may be optimized by independently sizing and modularly locating the ports in the design, which allows for symmetrical layouts of the ports if so desired. In addition, as will be described in more detail below, unidirectional polysilicon and uninterrupted diffusion segments in an opposing direction reduce the non-uniformities within the bitcell and aid in compliance with DFM rules of the semiconductor fabrication providers.

B. Memory Bitcell Layout

Figure 4:
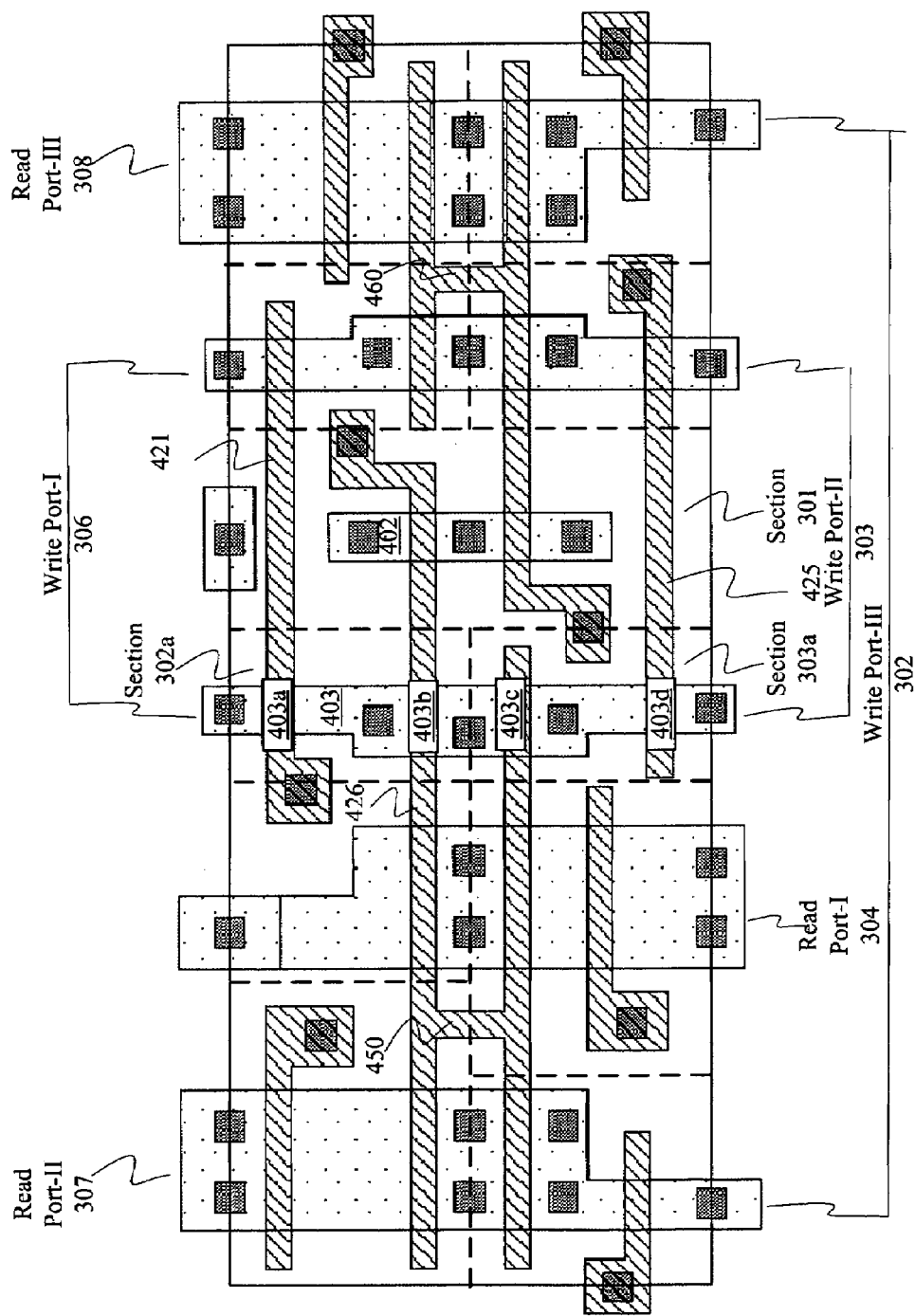
FIG. 4 illustrates a layout of a 6-port bitcell as per one embodiment of the present invention.

FIG. 4 illustrates an exemplary physical layout of a six port bitcell according to one embodiment of the invention. In this example, the bitcell comprises three differential write ports and three single-ended read ports. Diffusion materials are oriented vertically on the silicon and polysilicon segments are oriented in horizontal direction in order to reduce non-uniformities within the manufactured bitcell and improve electrical performance. When the bitcell is repeated in an array format, there are not any breaks in the diffusion layer nor are there any enclosed areas formed by the diffusion.

Certain transistors in the memory bitcell may be formed on the portion of polysilicon segments, which run over the diffusion segments. For example, an N-well section 301 may comprise the diffusion segment 402, which may be used to form two pull-up transistors that may be sized according to the electrical requirements of the bitcell. The N-well section 301 may have a N-well tap placed along the top portion of the N-well section. Various port modules may be allowed to be placed around the formed N-well section.

A single diffusion segment 403 may be used in forming left modules 306a, 303a of two write ports 306, 303 and contains two transistors for each of the two modules. Specifically, a pass gate transistor 403a may be formed on the top portion of the diffusion segment 403 where the polysilicon segment 421 overlaps the diffusion segment 403, which forms the left pass gate transistor of the write port-II. The pull-down transistor 403b may be formed below pass gate transistor 403a. The polysilicon segment for forming the pull-down transistor 403b may be the polysilicon segment 426. The pull-down transistor of the left module 303a belonging to the write port-II 303 may be formed below the pull-down transistor 403b, while the pass gate transistor 403d belonging to the module 303a may be formed at the bottom of the diffusion segment 403. The pull-down transistor 403c belonging to the left module 303a may utilize the polysilicon segment 424 while the pass gate transistor 403d utilizes polysilicon segment 425.

Shielding between bitlines and wordlines is provided in order to reduce the amount of inter-port coupling and an example thereof will be described later. In addition, a P-well tap may also be designed into the bitcell.

As previously discussed, the polysilicon segments used in forming the transistors are oriented in the same horizontal direction. This orientation minimizes systematic process-induced non-uniformities between the devices in the memory cell while diffusion segments oriented vertically may be used for interconnection of the horizontally oriented modules over which the transistors are formed. As the number of ports is expanded, additional connections may be made to the storage nodes of the bitcell. These connections may be made using the polysilicon segments, as illustrated in FIG. 4, resulting in a modular layout of the bitcell. For example, a vertical polysilicon segment 450 is provided that couple elements within the read port-II module 307 to the read port I module 304. Another vertical polysilicon segment 460 is provided that also couple elements within a differential port in the write port-I module 306 to a differential port in the write port-II module 303. One skilled in the art will recognize that these vertical polysilicon connections may be used to shorten the polysilicon connected distance between an outer edge of a bitcell to a pull-down device of the inverter cell. In various embodiments of the invention, multiple vertical polysilicon connections may be used within a bitcell design. This modular nature of the layout allows basic building modules to be used in expanding the number of ports in the bitcell, which further simplify the design process.

As shown in FIGS. 3 and 4, exemplary ports read port-I 304, read port-II 307, read port-III 308, write port-I 306 and write port-II 303 are modularly included within the layout in a similar fashion as described above. One skilled in the art will recognize that the number of ports and/or design layout of the bitcell may be changed using the modular characteristics of the above-described layout techniques. For example, it may be advantageous to have read ports evenly distributed on two complementary halves of the bitcell in order to make the internal node capacitance as symmetric as possible.

C. Circuit Representation of a Modularly Constructed Bitcell

Figure 5:
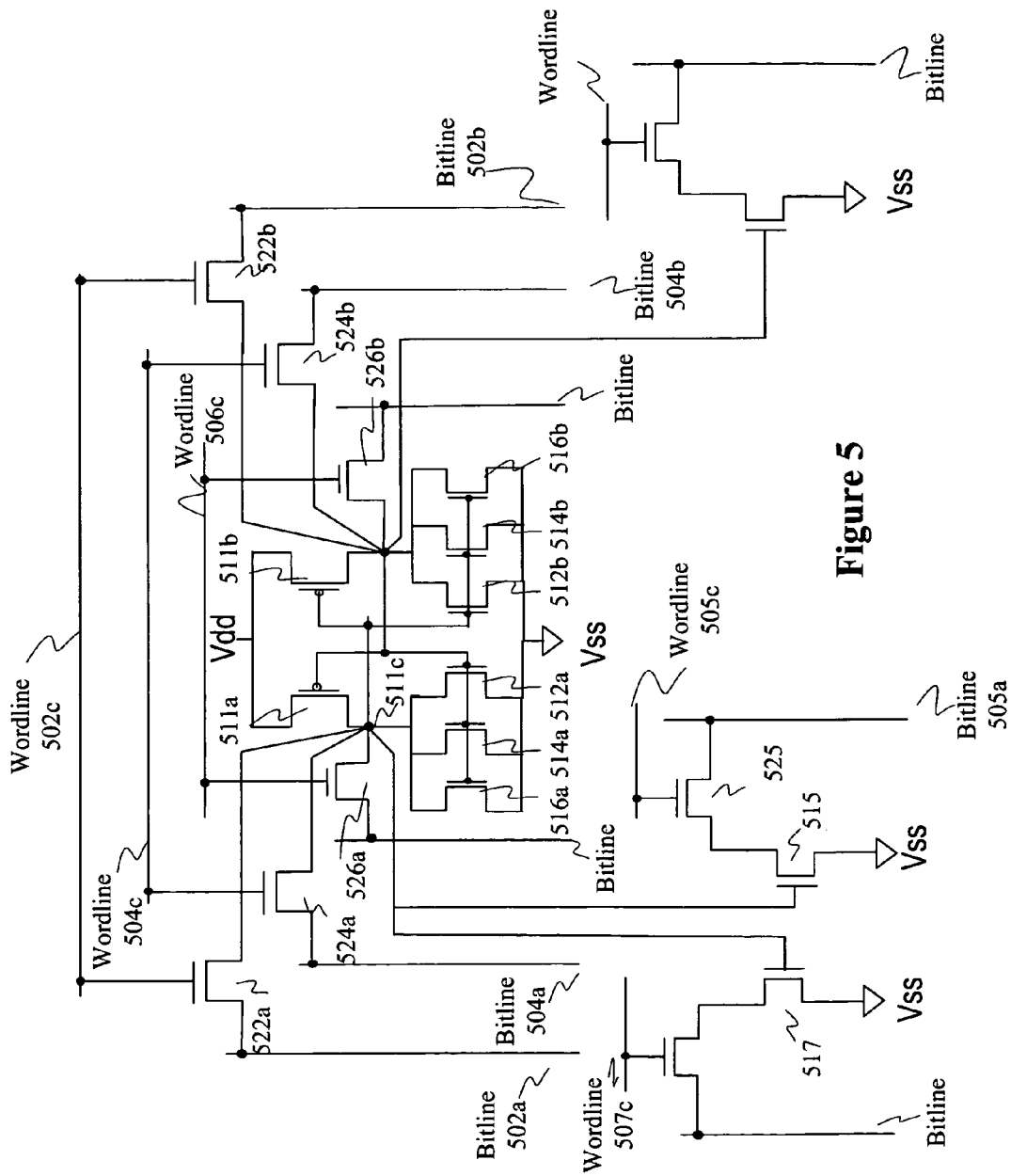
FIG. 5 illustrates a circuit diagram of a 6-port bitcell as per one embodiment of the present invention.

FIG. 5 shows a circuit level schematic of a six port memory bitcell according to one embodiment of the invention. As previously described, this exemplary six port memory bitcell comprises three differential write ports and single-ended read ports. As ports were added to the bitcell, connections to storage nodes of the bitcell were made to modularly integrate the ports.

The bitcell comprises two pull-up transistors 511a and 511b, which may be PMOS devices. The source of each may be connected to the constant voltage line $V_{dd}$. Each of the differential ports of the memory bitcell are controlled by two NMOS transistors in series. One of the two transistors may be a pass gate device while the other may be a pull-down device. For example, the write port-I is controlled by the left NMOS pass gate transistor 522a, the gate of which is connected to the word line 502c. A bitline 502a connects to the transistor 522a and a right pass gate transistor 522b connects the gate to the wordline 502c, while one of its terminals connects to the complementary bit line 502b.

The pull-down transistors used for write ports may be split into a number of pull-down devices. For example, the left pull-down transistor may be split into three devices resulting in three left pull-down devices 516a, 514a and 512a. Similarly, the right pull-down transistor may be split into three pull-down devices 516b, 514b and 512b. Transistors 512a and 512b form the pull-down transistors of the write port-I.

The write port-II is controlled by left pass gate transistor 524a which is connected to the left pull-down transistor 514a, and the right pass gate transistor 524b, which is connected to the pull-down transistor 514b. The gate of the pass gate transistors 524a and 524b connect to a common word line 504c. The complementary bit lines 504a and 504b connect to the terminals of each of pass gate devices 524a and 524b. The write port-III is controlled by the pull-down transistors 516a and 516b and the pass gate transistors 526a and 526b. The gates of each of the pass transistors connect to a common wordline 506c.

A read port-I utilizes transistors 525 and 515 in which the gate of the pass gate transistor connects to wordline 505c. One of the terminals of the pass gate transistor 525 connects to the bit line 505a while the other terminal connects to the other transistor 515 which connect to the storage node 511c. The other terminal of the transistor 515 connects to the constant voltage $V_{ss}$. The other read ports are added utilizing two NMOS transistors in a similar manner such that read port-II comprises the gate of the pass gate transistor 527 being connected to the wordline 507c.

One skilled in the art will recognize that various multiport bitcells may be designed by modularly connecting the ports within the bitcell. Furthermore, one skilled in the art will recognize that the manner in which port modules are inserted into the bitcell are compliant with various DFM rules.

D. Backend Layout

Figure 6A:
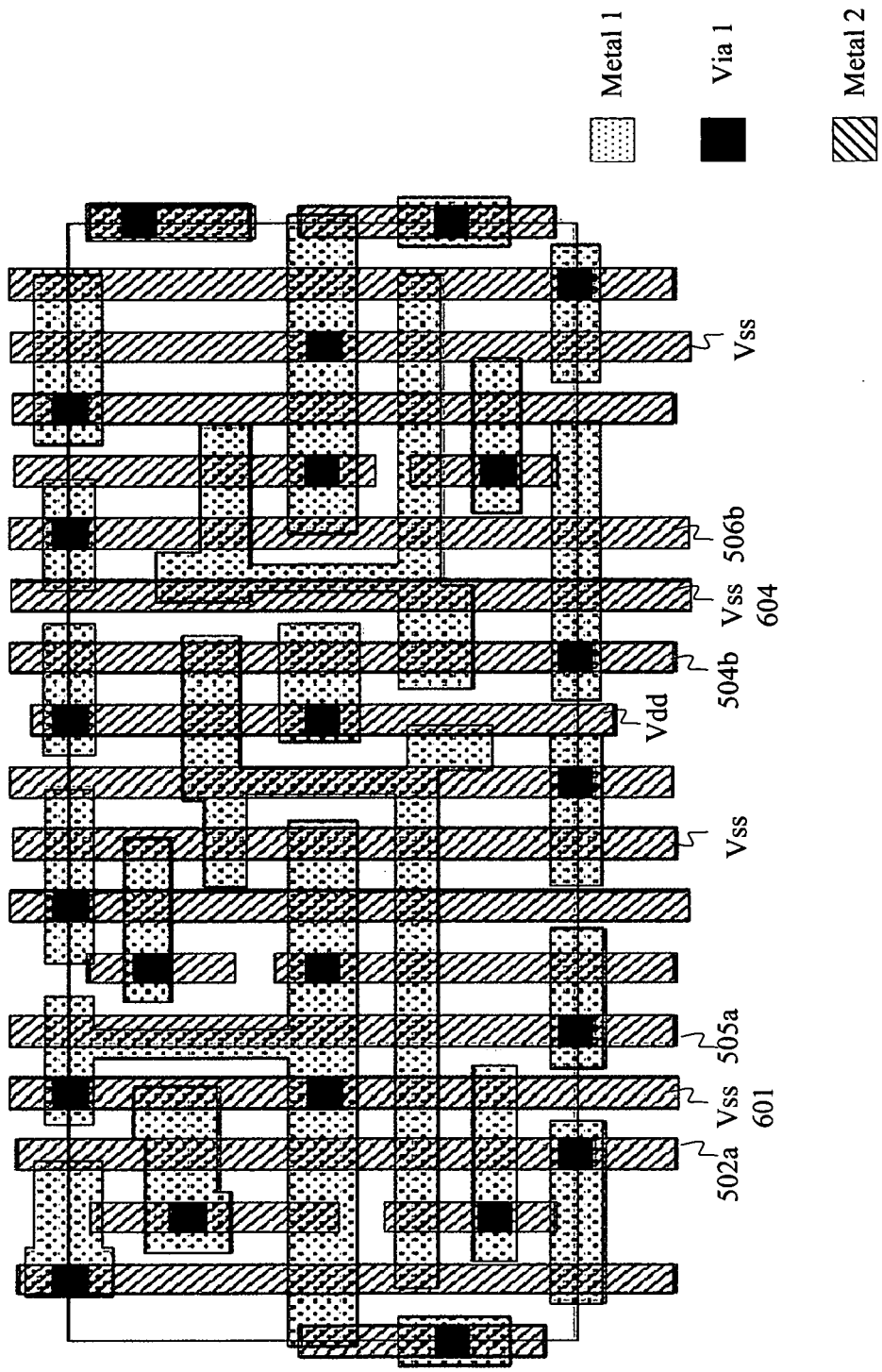
FIG. 6(a) illustrates a layers based backend layout of 6-port bitcell as per one embodiment of the present invention.

Various terminals of the ports and transistors of the memory bitcell may be interconnected using metallic interconnecting lines. The layers of the metallic interconnecting lines may be used for various purposes such as forming layers that may be used as wordlines or bitlines. FIG. 6(a) shows the backend layout of the metal layers of the six port memory bitcell comprising three write ports and three read ports, as per one embodiment of the invention.

The bitlines and constant voltage lines, such as $V_{ss}$ and $V_{dd}$, may be realized in a metal ("Metal 2") as shown. Vertical placement of the bitlines allows locating constant voltage lines, such as $V_{ss}$ and $V_{dd}$ lines, between the bitlines. These voltage lines effectively shield the bitlines and reduce cross-coupling/crosstalk between ports. Additional constant voltage lines may be added to provide shielding between other bitlines, which may normally be placed adjacently. For example, an additional $V_{ss}$ line 601 may be provided between the bitlines 502a and 505a. The bitlines 504b and 506b may be separated by $V_{ss}$ line 604.

Figure 6B:
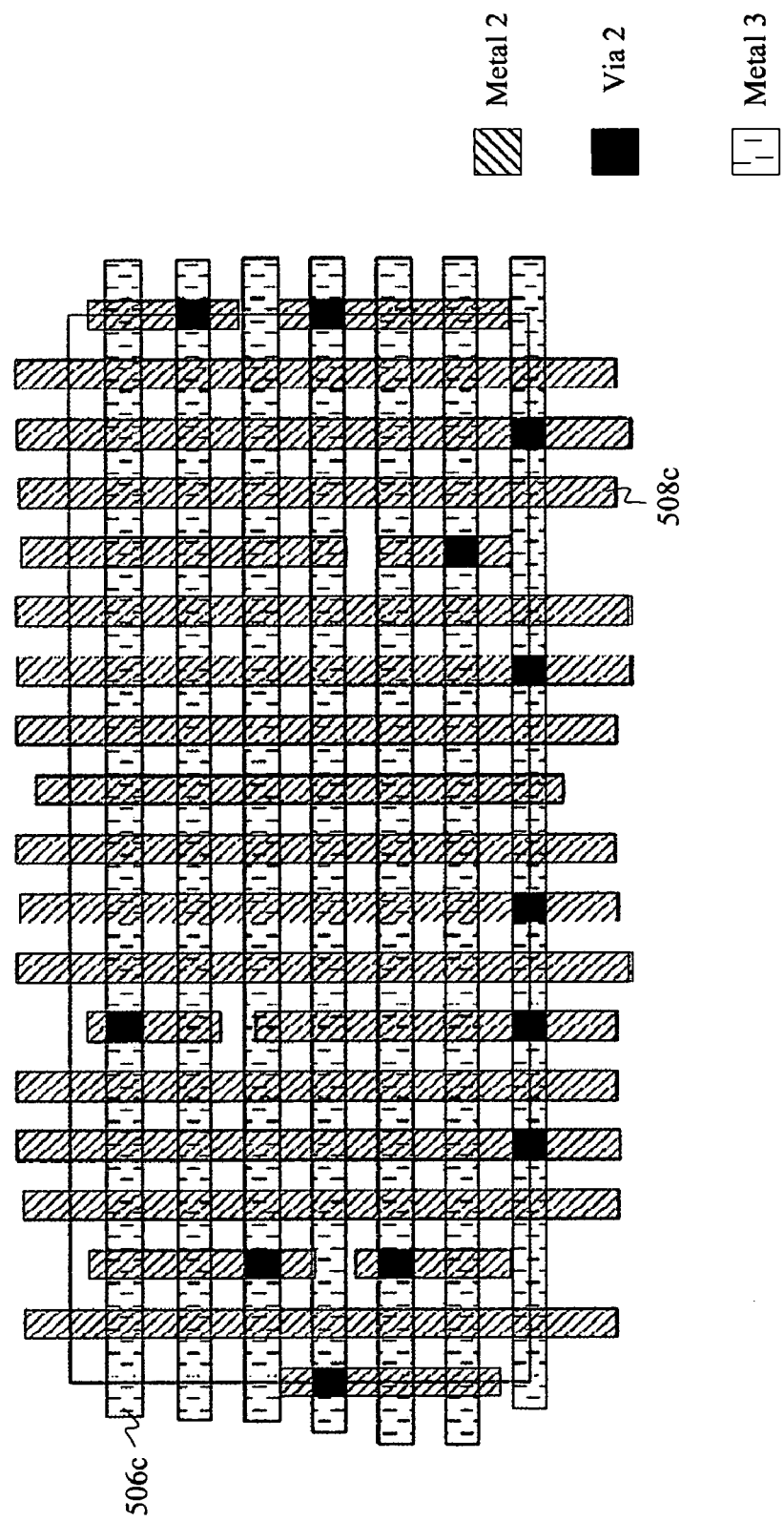
FIG. 6(b) illustrates a layers-based backend layout of a 6-port bitcell as per one embodiment of the present invention.

FIG. 6(b) shows a physical layout of wordlines for each of the various ports of the six port memory bitcell. The word lines may be implemented in metal as indicated in "Metal 3." Wordlines corresponding to each of the bitcells are implemented one over the other. For example, the word line 506c corresponding to write port-III may be placed horizontally and over the wordline 508c corresponding to the read port-III. The horizontally oriented uniform wordlines ensure a check on the height of the bitlines. The height of the bitcell in this case may be six wordlines as needed by the six ports of the memory cell.

The method of design and layout of a memory bitcell may be applied to numerous types of bitcells in which the number of ports and layout may be modularly changed. Examples of these other layouts are provided in FIGS. 7-10.

Figure 7:
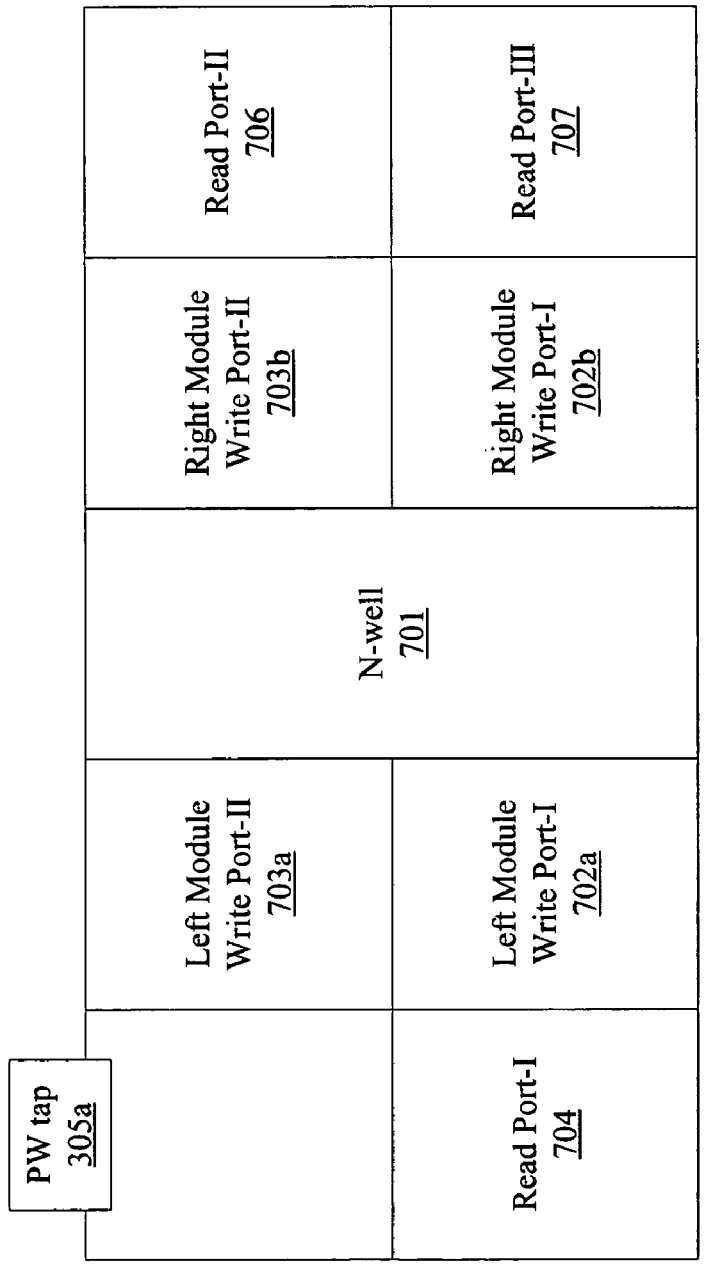
FIG. 7 illustrates a schematic layout of a 5-port bitcell as per one embodiment of the present invention.

FIG. 7 illustrates an exemplary five port bitcell having two differential write ports and three single-ended ports. The left module 702a of write port-I is placed on left side of the N-well section 701 and the right module of write port-I 702b is placed on the right side of the N-well section 701. A write port-II 703 comprising a left module 703a and a right module 703b is placed over each of the left module 702a and the right module 702b. If additional read ports are to be added, then vertical diffusion layers should be added.

As previously described, port modules may be inserted to expand the port count without disturbing the initial layout. For example, a read port-I 704 is added by including a diffusion segment, a part of which is used in forming the transistors characterizing the read port 704, while the other part is used as PW tap. Similarly, a read port-II 706 and read port-III 707 may be added by adding a diffusion segment to the right of the right modules 703b and 702b.

Figure 8:
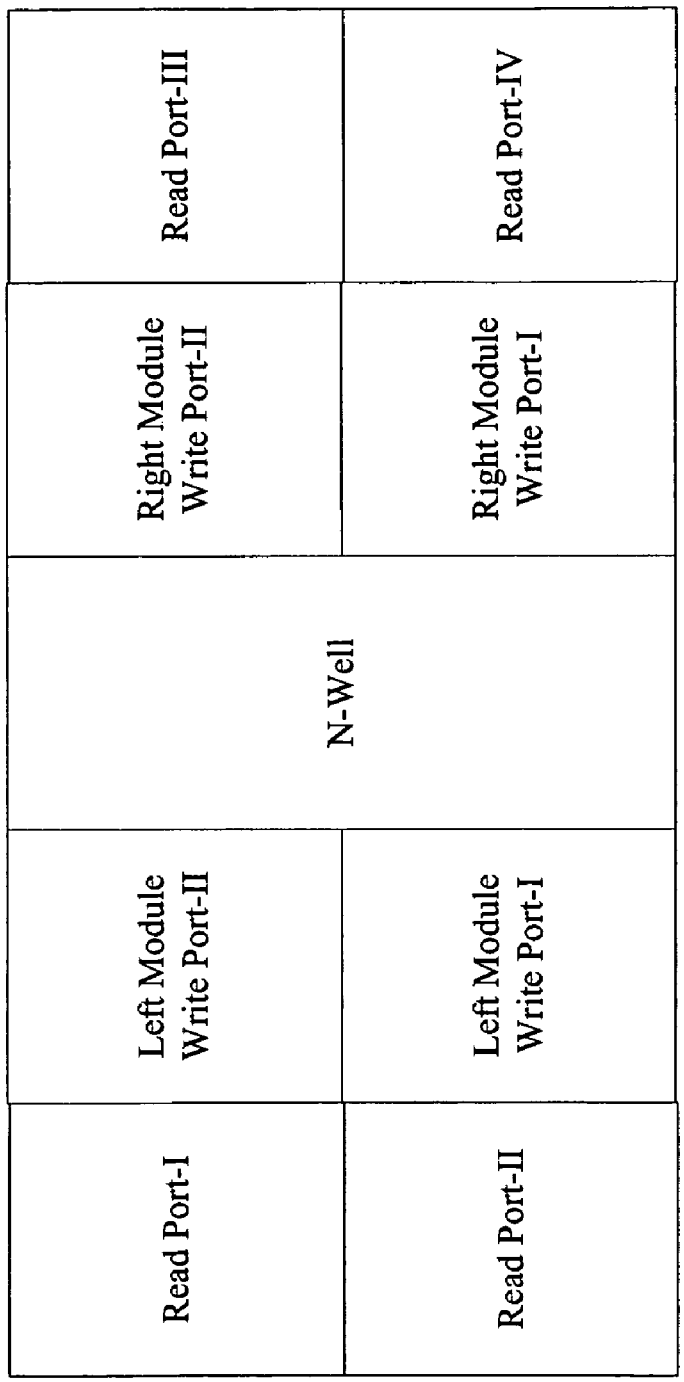
FIG. 8 illustrates a schematic layout of a 6-port bitcell as per one embodiment of the present invention.
Figure 9:
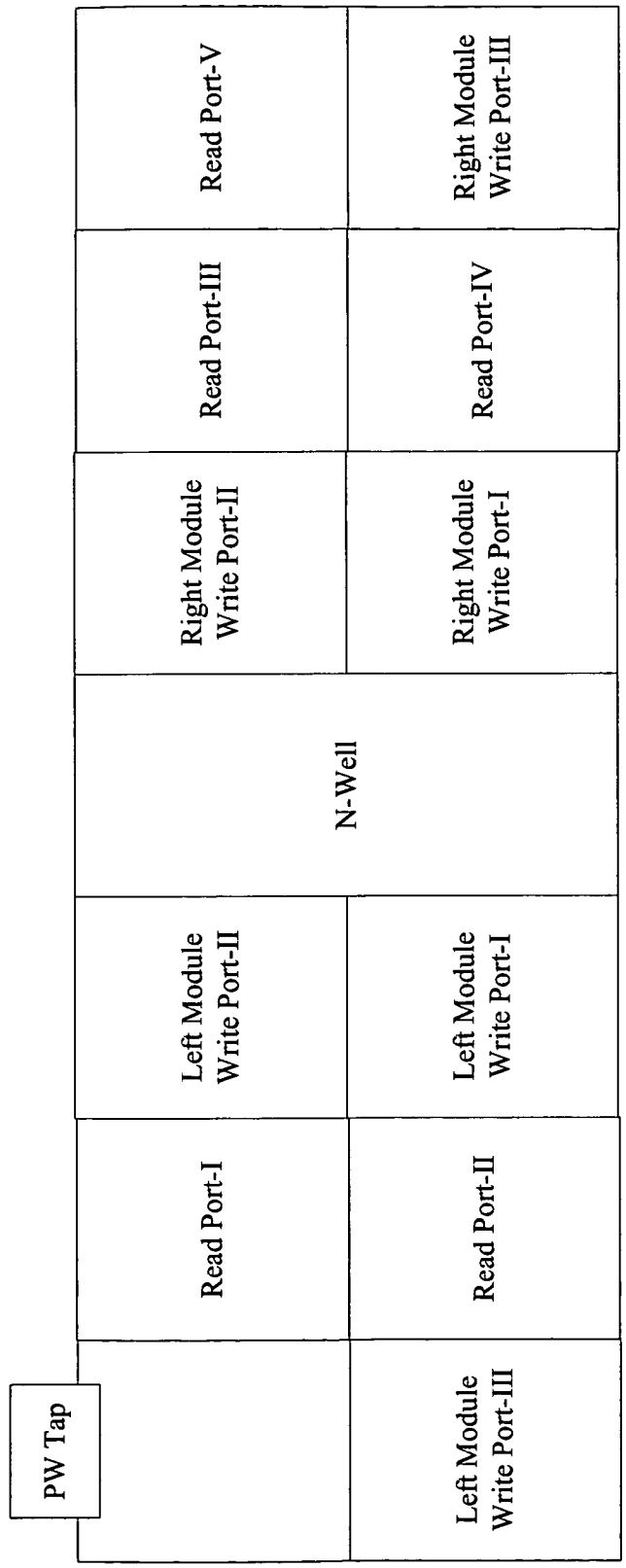
FIG. 9 illustrates the schematic layout of a 8-port bitcell as per one embodiment of the present invention.

FIGS. 8-10 illustrate other embodiments of the invention in which ports are modularly expanded in a bitcell in a similar fashion. For example, FIG. 10 illustrates a hybrid embodiment in which read modules are divided in half to more efficiently reduce the area required to implement the design. Split-gate pulldown devices are used that enable an increased beta ratio and greater flexibility in inserting the port modules within the bitcell design. This division in read port modules results in improved bitline capacitance.

The foregoing description of the invention has been described for purposes of clarity and understanding. It is not intended to limit the invention to the precise form disclosed. Various modifications may be possible within the scope and equivalence of the appended claims.

We claim:

1. A system for creating a modular port-scalable memory bitcell, the system comprising:
    a basic memory storage node having at least one associated port, a first pull-down device and a second pull-down device;
    a first modular port cell, having a first modular connection that is coupled to the first pull-down device, that communicates data to a memory cell;
    a second modular port cell, having a second modular connection that is coupled to the second pull-down device, that communicates data to the memory cell; and
    wherein the first and second modular port cells are coupled to the basic memory storage node without disturbing the general layout of the basic memory storage node.

2. The system of claim 1 wherein the first modular port cell further comprises an access device, coupled between a first wordline, a first bitline and the first pull-down device, that accesses data contained within the memory cell.

3. The system of claim 1 wherein the first modular port cell is a single-ended read port module.

4. The system of claim 3 wherein the first modular connection is coupled between the first pull-down device and a read transistor in the single-ended read port module.

5. The system of claim 1 wherein the second modular port cell is a differential write port module.

6. The system of claim 5 wherein the second modular port cell comprises:
    a second access device, coupled between a second wordline, a second bitline, and the second pull-down device, that accesses or changes data within the memory cell;
    a third access device, coupled the second wordline, a third bitline, and the first pull-down device, that accesses or changes data within the memory cell; and
    wherein the second and third access devices differentially access or change data within the memory cell.

7. The system of claim 1 wherein all poly-gates within the memory bitcell are running in the same direction.

8. The system of claim 1 further comprising a first constant voltage line, coupled between a first bitline and a second bitline within a differential write port module, that provides a constant voltage to a write transistor within the differential write port module and reduces cross-coupling between the first bitline from the second bitline.

9. The system of claim 1 wherein an array of bitcells includes modular port-scalable memory bitcell, and there are no breaks within diffusion layers and no enclosed areas formed by the diffusion.

10. A method for designing a multiport memory bitcell, the method comprising:
    defining a basic memory storage node having a first bitline that is coupled to a first pull-down device and a second bitline that is coupled to a second pull-down device;
    attaching a first single-ended read port module to the basic memory storage node by coupling a third bitline to the first pull-down device;
    attaching a first differential write port module to the basic memory storage node by coupling a fourth bitline to the second pull-down device, and coupling a fifth bitline to the second pull-down device and a second write transistor; and
    wherein all the polysilicon segments are oriented in a first direction and all the diffusion segments are oriented in a second direction and the general layout of the basic memory storage node is undisturbed.

11. The method of claim 10 wherein the first single-ended read port module is coupled to the basic memory storage node without having to add a third pull-down device within the first single-ended read port module and the basic memory storage node.

12. The method of claim 10 wherein the first differential write port module is coupled to the basic memory storage node without having to add a third pull-down device within the first differential write port module and the basic memory storage node.

13. The method of claim 10 further comprising manufacturing a constant voltage line between a first bitline and a second bitline within the first differential write port module to reduce cross-coupling between the first and second bitlines.

14. The method of claim 10 wherein the multiport memory bitcell is a multiport SRAM bitcell.

15. The method of claim 10 wherein the first differential write port module is structured so that a second differential write port module may be directly coupled to the first single-ended read port module in order to increase the port count within the multiport memory bitcell.

16. The method of claim 10 wherein the first single-ended read port module is halved to allow symmetric insertion within the multiport memory bitcell.

17. A modular multiport memory bitcell comprising:
an N-well having a first pull-up device;
a first modular write port cell, coupled to the N-well, having a first and second bitline on which data is written to or read from the first modular write port cell;
a second modular write port cell, coupled to the N-well, having third and fourth bitlines on which data is written on or read from the second modular write port cell;
a first modular read port cell, coupled to the first modular write port cell, having a fifth bitline on which data is read from a memory cell; and wherein the first modular read port cell, the first modular write port cell, and second modular write port cell contain independent functionality that permits modular adaptation and expansion of the modular multiport memory bitcell.

18. The multiport memory bitcell of claim 17 wherein the bitcell reads and writes data to an SRAM memory device.

19. The multiport memory bitcell of claim 17 wherein the port count on the bitcell may be modularly scaled by a designer.

20. The multiport memory bitcell of claim 17 further comprising a constant voltage metallic line located between the third and fourth bitlines to reduce cross-coupling between the third and fourth bitlines.

* * * * *